United States Patent [19]

Wallis et al.

[11] Patent Number: 5,089,716
[45] Date of Patent: Feb. 18, 1992

[54] SIMPLIFIED DRIVER FOR CONTROLLED FLUX FERRITE PHASE SHIFTER

[75] Inventors: David W. Wallis, Decatur; James R. Ashworth, Norcross; Charles G. Wier, Suwanee, all of Ga.

[73] Assignee: Electromagnetic Sciences, Inc., Norcross, Ga.

[21] Appl. No.: 333,961

[22] Filed: Apr. 6, 1989

[51] Int. Cl.$^5$ .............................................. H01P 1/19
[52] U.S. Cl. ................... 307/101; 333/24.1; 307/265
[58] Field of Search ............... 307/401–423, 307/272.1–273, 278, 279, 282, 309, 314, 101, 104, 603, 511, 265, 273; 323/214; 328/155; 333/1.1, 102, 24.1, 158; 343/754, 777, 778, 787, 788, 824; 361/139, 143, 146, 149, 152, 153, 204; 330/4.8, 8; 342/368, 371–373; 455/139

[56] References Cited

U.S. PATENT DOCUMENTS

| | | | |
|---|---|---|---|
| 2,894,216 | 7/1959 | Crowe | 333/161 |
| 3,408,597 | 10/1968 | Heiter | 333/24.1 |
| 3,425,003 | 1/1969 | Mohr | 333/161 |
| 3,471,809 | 10/1969 | Parks et al. | 333/161 |
| 3,524,152 | 8/1970 | Agrios et al. | 333/24.1 |
| 3,539,950 | 7/1969 | Freibergs | 333/161 |
| 3,585,536 | 6/1971 | Braginski et al. | 333/24.1 X |
| 3,599,121 | 8/1971 | Buck et al. | 333/24.1 X |
| 3,656,179 | 4/1972 | DeLoach | 333/161 |
| 3,758,886 | 9/1973 | Landry et al. | 333/21 R X |
| 3,849,746 | 11/1974 | Mason et al. | 333/24.1 |
| 3,952,267 | 4/1976 | Dischert | 333/24.1 |
| 3,986,149 | 10/1976 | Harris et al. | 333/24.1 X |
| 4,001,733 | 1/1977 | Birch et al. | 333/24.1 |
| 4,042,831 | 8/1977 | Lenhoff, Jr. | 307/412 |
| 4,047,046 | 9/1977 | Milberger et al. | 307/101 |
| 4,349,790 | 9/1972 | Landry | 333/24.1 |
| 4,434,409 | 2/1984 | Green | 333/24.1 |
| 4,445,098 | 4/1984 | Sharon et al. | 333/1.1 |
| 4,469,961 | 9/1984 | Milberger et al. | 307/270 |

Primary Examiner—A. D. Pellinen
Assistant Examiner—David Osborn
Attorney, Agent, or Firm—Nixon & Vanderhye

[57] ABSTRACT

A monostable circuit with device-status feedback control to an external timing terminal is used to controllably change the magnetization state of a ferrite phase shifter core. A pair of such bistable circuits with suitable feedback controls permits a single command pulse of controlled duration to controllably both reset a ferrite core to a saturated magnetic state and then subsequently set the core to a desired non-saturated magnetization state (corresponding to the time duration of the single command pulse). By addition of suitable steering circuits, the controlled resetting and setting of one or more pairs of such ferrite cores can also be achieved using the same single command pulse. The ability to both reset and set plural ferrite phase shifter cores with but a single command pulse of controlled duration permits considerable simplification of beam steering control wiring for a two-dimensional phased array of RF radiators (e.g., so as to provide electronic beam steering control).

23 Claims, 4 Drawing Sheets

SIMPLIFIED DRIVER FOR CONTROLLED FLUX FERRITE PHASE SHIFTER

FIELD OF THE INVENTION

This invention relates generally to drive circuits for controlling electrical current flow (or corresponding voltage) to a device having plural states which are selectively determined by such current flow (or corresponding voltage). It is particularly concerned with a simplified driver circuit for resetting and setting magnetic flux in ferrimagnetic cores of an RF phase shifter. For example, it is especially suited for driving controlled-flux ferrimagnetic phase shifters in a densely packed two-dimensional array used for feeding a corresponding two-dimensional array of RF radiators so as to control beam steering or other attributes of the radiation pattern associated with the array aperture.

RELATED APPLICATIONS

This application is related to the following copending commonly assigned patent applications (the content of which is hereby incorporated by reference):
Roberts, et al. Ser. No. 07/330,617, filed Mar. 30, 1989, "Hybrid Mode RF Phase Shifter"
Roberts, Ser. No. 330,638, filed Mar. 30, 1989, "Reciprocal Hybrid Mode RF Circuit For Coupling RF transceiver To An RF Radiator"
Rigg, Ser. No. 07/353,431, filed May 18, 1989, "Distributed Planar Array Beam Steering Control"

BACKGROUND OF THE INVENTION

Electronically scanned phased array antenna systems are complex microwave and electronic assemblies. Not only are the electronic drivers associated with such phase shifters complicated, even the interconnection of numerous wires is cumbersome and complicated. The complexity is greatly magnified when relatively large scale two-dimensional arrays of radiators are to be fed (e.g., a 64×64 array includes 4,096 separate radiators which must be individually fed with controlled phase RF signals). Of course in a receive mode, incoming RF signals from each of the 4,096 radiators also must be correspondingly selectively phased and combined.

Ferrite or ferrimagnetic phase shifter devices require short pulses of current through magnetizing wires to change the remnant magnetization of one or more ferrite members and thereby change from one "phase state" (i.e., a phase shift of predetermined amount) to another. A related commonly assigned prior issued U.S. Pat. No. 4,445,098—Sharon et al. (the entire content of which is hereby incorporated by reference), explains in more detail how the magnetization of a given ferrite core (or set of cores) typically is first "reset" by magnetically saturating the cores in a first sense. Thereafter, the desired level of remnant magnetization (and hence a corresponding phase state) is achieved by "setting" the core with a controlled current pulse producing a controlled degree of magnetization in the opposite sense.

In short, to reliably and predictably change the phase state of such ferrite phase shifters, a relatively large pulse of current is typically first passed in one direction (or polarity) through a magnetization wire magnetically linked to the core (e.g., by being threaded through the center of an axially extended toroid core) so as to saturate the ferrite in a corresponding sense. After this initial "reset" pulse of relatively large magnitude, then a smaller "set" pulse of current having opposite polarity is passed through a magnetization wire also linked to the core (typically, a separate wire also passing through the toroid center) so as to "set" the phase shifter to a desired remnant state of magnetization (and hence to a desired phase state).

In most practical systems, there is a need to control pairs of ferrite toroids. Each pair may be, for example, two separate phase shifters or a single dual-toroid phase shifter (e.g. see Sharon et al). With this requirement comes the need to supply desired phase shift commands for both toroids and an execution command line. Typically, an interface for this sort of application may require as many as three interface lines for each phase shifter (e.g., data, clock, enable/execute unless one or more of these are bussed in common to all phase shifters).

Accordingly, if such prior interfaces require plural (e.g., three) separate conductors for each phase shifter drive circuit, a 64×64 array may require similar multiples of 4,096 lines (plus common ground and power bus lines connected in common to all 4,096 drive circuits). Accordingly, in the prior art example just referenced, as many as three times 4,096 or 12,288 separate conductors (plus the common ground and power bus conductors) may have to be separately routed to and connected to the drive modules. For phased arrays operating in the neighborhood of 10 GHz, the center-to-center spacing between elements of the array is only on the order of 0.6 inch. Furthermore, if the drive circuits are to be physically located near the array aperture (as is desirable), then all of these conductors must be properly routed to a (typically remote) beam steering computer which must rapidly cause all of these lines to have the proper signals placed upon them in a timely manner to effect a desired beam steering function.

SUMMARY OF THE INVENTION

Now however, we have discovered a new drive circuit arrangement which greatly reduces the complexity of the overall driving electronics necessarily associated with the many phase shifter elements of a typical phased array system. Compared to prior approaches, our invention so simplifies the electronic driver that it becomes a relatively inexpensive, small and easy to assemble part of the system.

In part, our invention achieves such simplification because it makes it possible to encode all of the necessary drive data for resetting and setting one or more given ferrite core(s) into a single command pulse (plus a commonly bussed A/B select line). This single command pulse therefore may be transmitted through a single dedicated conductor to each phase shifter drive circuit in the array. Furthermore, one or more further ferrite cores may also be simultaneously reset in response to the same command pulse and thereafter independently set in response to a second pulse issued on the same command line. As will be appreciated, such a great reduction in the number of necessary conductors greatly simplifies even the physical interconnection of the necessary electronic drivers to the central beam steering or other control processor. It also greatly simplifies the task of generating and issuing all the signals required to effect complex beam steering functions.

In the exemplary embodiment, this simplification of the driver is achieved, in part, because a monostable multivibrator is employed with unusual feedback control circuits to minimize the number of required interface control signals. For example, in the presently preferred exemplary embodiment, a pair of monostable circuits is employed to effect controlled resetting and setting of a ferrite core in response to a single command pulse (having a time duration related to the desired final phase state).

By employing suitable steering circuits and a single further A/B selection command bus line (bused in common to all drivers), the same pair of monostable circuits can be used for (a) simultaneously resetting one or more pairs of cores and (b) thereafter setting a first one of the cores (in one or more such pairs) to a controlled final set magnetization state and, in response to a second common pulse on the same control line, also setting the second core (in one or more such pairs) to a desired final magnetization state. In this arrangement, the ground, power and steering select (A/B) lines may be bused in common to all drivers and but a single command line may be individually routed from the beam steering processor to each of the driver circuits. Thus, if there are 4,096 phase shifters in an array, there would be 4,096 individual command lines plus a common ground bus, a common power bus and an A/B steering select bus for a total of 4,099 final interface lines.

As will be appreciated, by using added steering circuits and steering select busses, one may use further command pulses on the same command line to effect controlled setting of further one(s) of the cores reset by the first command pulse.

A monostable multivibrator typically is defined as a circuit which exists in a predetermined quiescent state. It requires a trigger signal of some sort to induce a transition from that stable state to a quasi-stable state (e.g., where it remains for a time duration that may be long in comparison to the required transition time between states). Eventually, a true monostable multivibrator will return from the quasi-stable stable state to its quiescent with no external signal being required to induce this reverse transition.

In typical implementations, a monostable multivibrator may be provided in integrated circuit chip form with externally accessible pins for connection with an external resistance-capacitance (RC) timing circuit that controls the duration of the quasi-stable state. Typically, the external capacitor of this RC circuit is discharged upon transitioning to the quasi-stable state. As the capacitor charges back towards a supply voltage, the voltage on one of the external pins reaches a predetermined level (e.g., about two-thirds of the supply voltage) which causes transition back to the quiescent stable state.

In the exemplary embodiment of this invention, such an externally accessible timing control terminal is used in conjunction with special feedback circuits for delivering signals representative of the state of the device being driven (e.g., the magnetization state of a ferrimagnetic core in a phase shifter). For example, feedback control for the core resetting operation can be derived by sensing current (or a voltage representation of said current) through a magnetization wire of the phase shifter. Here, as soon as the core becomes magnetically saturated, there is an abrupt reduction in the time rate of change of flux. This causes an abrupt increase in the current passing through the magnetization wire and a corresponding abrupt decrease in the voltage across the magnetization wire of the toroid. A suitable current-to-voltage conversion may then be used for applying an appropriate voltage level on the external timing pin of the monostable to transition back to the quiescent stable state as soon as magnetic flux saturation in the core has been attained.

For subsequent "setting" operation, the initial or "preset" charge on a timing capacitor can be controlled as a function of the time duration of the same command pulse used to initiate the resetting operation. Provided that the command pulse duration is at least as long as the required resetting operation, then a second monostable circuit can be transitioned to its quasi-stable state upon the falling terminal edge of such a command pulse and, due to the preset charge on the timing capacitor, its dwell time in the quasi-stable state will be a function of the command pulse duration.

If the voltage source used for charging the RC timing circuit is also made proportional to the voltage across the magnetization winding (e.g., by using the voltage induced 1:1 in another magnetization wire passing through the same toroid), then the timing circuit acts as a first order integrator. In this manner, the dwell time of the "set" monostable is also determined as the time integral of voltage across the magnetization winding. As is already well-known, the value of such an integral is proportional to the final phase state shift of a "set" phase shifter (which as explained in the above-referenced Sharon et al patent, is related to the remnant magnetization after cessation of the setting magnetization pulse).

As previously mentioned, typical practical installations require the related setting of a pair of ferrite toroids (e.g., in a dual toroid phase shifter as in Sharon et al). By the addition of suitable steering circuits, the operation of the "reset" monostable may be inhibited and the output of the second or "set" monostable may be re-routed to a different ferrite core when a second command pulse is presented over the same command wire. In this manner, a first single command pulse may be used to simultaneously reset both ferrite cores and to set one of the cores to a value determined by the duration of this initial command pulse. A succeeding command pulse on the same line (occurring after a transition in a steering command commonly bused to all modules) may then be used to controllably set a second ferrite core (to a value determined by the duration of the second command pulse on the same command line).

A typical phase shifter may also include successive pairs of dual toroid phase shifting sections within the same or successive waveguides. Our simplified drive circuit can also be used for simultaneously resetting and setting ferrite cores in plural such pairs of these dual toroid phase shifter sections.

BRIEF DESCRIPTION OF THE DRAWINGS

These as well as other objects and advantages of this invention will be more completely understood and appreciated by carefully studying the following detailed description of presently preferred exemplary embodiments of this invention in conjunction with the accompanying drawings, of which.

DETAILED DESCRIPTION OF EXEMPLARY EMBODIMENTS

Figure 1:
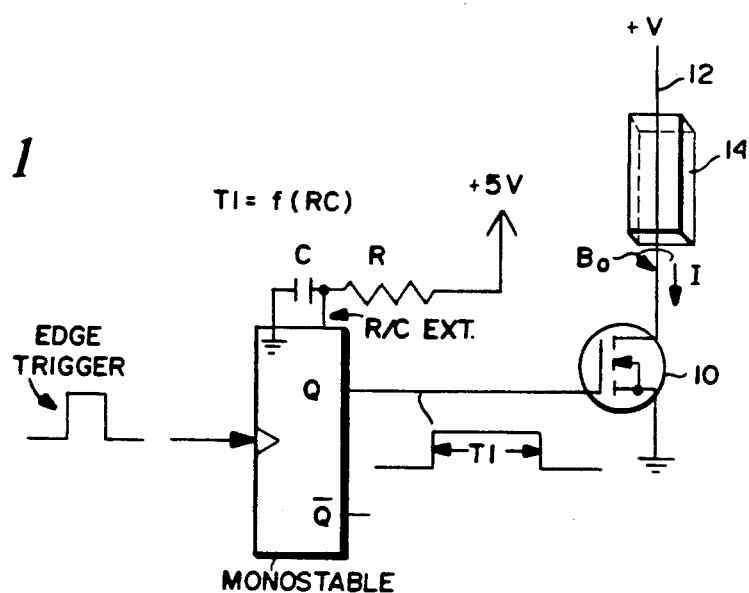
FIG. 1 is a simplified schematic circuit diagram showing one manner in which a conventional monostable circuit might be used to drive current through the magnetizing wire of a ferrite core for a predetermined duration.

A typical monostable circuit is shown in FIG. 1 where resistor R and capacitor C are connected to externally available terminals of a monostable so as to control the time duration T1 of its quasi-stable state when triggered by the leading edge of an input trigger pulse. In particular, the initial quiescent supply voltage charge on capacitor C is rapidly discharged until the voltage at the R/C external pin reaches a predetermined level (e.g., typically about one-third of the supply voltage) when the monostable is first triggered, and the rate at which it returns toward its quiescent value is determined by the RC time constant of the externally connected R/C circuit as shown in FIG. 1. When the voltage at the R/C external pin reaches a predetermined level (e.g., typically about two-thirds of the supply voltage), the monostable will revert to its quiescent stable state thus terminating an output pulse at Q after a duration T1.

As also depicted in FIG. 1, this sort of conventional monostable circuit may be directly applied for use in a ferrite core driver by adding transistor 10 controlled by the Q output of the monostable so as to switch a relatively heavy current pulse I through a magnetizing wire 12 threaded through the center of an elongated ferrite toroid core 14 so as to change the remnant magnetic flux $B_o$ in the ferrite toroid.

Although conventional monostable circuits such as shown in FIG. 1 can be used in this straightforward manner to supply drive current to magnetization wire 12, an external fixed RC circuit is not an ideal way to control the time duration T1 of current flow through the magnetizing wire.

However, if one removes the usual resistor/capacitor circuit from the multivibrator's external timing terminals and then triggers the monostable to its quasi-stable state, it will tend to stay there without limit since no external timing circuit is provided.

Figure 2:
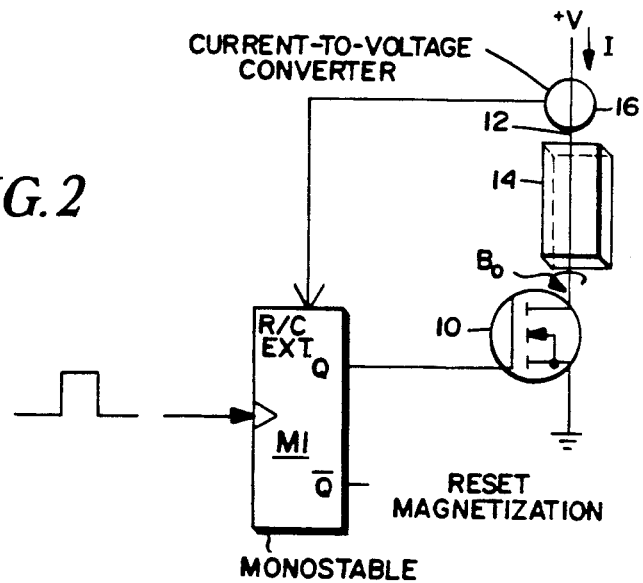
FIG. 2 is a schematic circuit diagram similar to that of FIG. 1 but showing a device-status sensitive feedback circuit (e.g., a current-to-voltage converter) to the external timing control circuit of the monostable so as to effect a proper reset magnetization of the ferrite core as one exemplary embodiment of this invention.

As depicted in the exemplary embodiment of FIG. 2, this feature of a monostable drive circuit permits one to replace the usual resistor/capacitor combination with active device-status feedback (e.g., representing the magnetization state of the ferrite core itself), so that the monostable will only toggle back to its quiescent stable state when the current through the magnetizing wire 12 reaches a desired predetermined level (i.e., when the magnetic flux of the ferrite core 14 has a reached a desired predetermined level).

Thus, if a suitable current-to-voltage converter 16 is added in series with wire 12, the resulting voltage out of converter 16 may be applied to the external timing terminal of the monostable M1 to provide a closed loop control. This leaves the monostable M1 in its quasi-stable state only as long as necessary to saturate and thus "reset" the magnetic flux within core 14. In particular, when saturation is achieved, a sharp current spike will be encountered (due to the sharp reduction in the effective inductance associated with the magnetizing wire). This will give rise to a sharp increase in the voltage output of converter 16 which, via the external timing terminal of the monostable M1, causes it to immediately transition back to the quiescent stable state. Accordingly, a monostable M1 with active feedback as shown in FIG. 2 is suitable for resetting the magnetization of a typical ferrite core 14 in a ferrite phase shifter.

Figure 3:
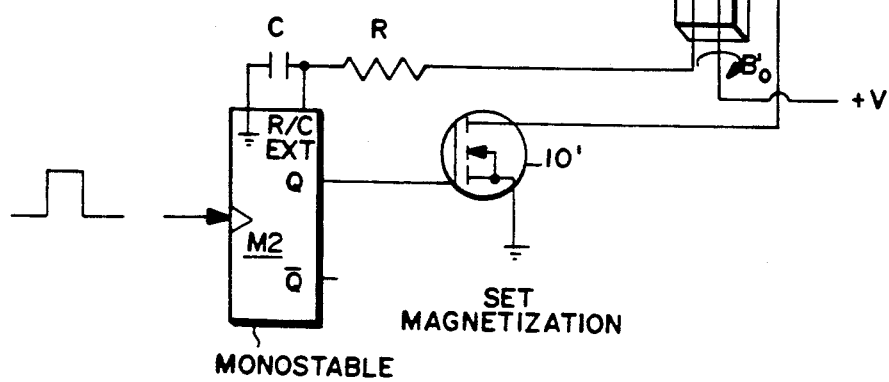
FIG. 3 is a schematic circuit diagram similar to that of FIGS. 1 and 2 but showing a still further modified feedback circuit to the external timing control of the monostable so as to control the duration of magnetizing current through a ferrite core as a function of the integral of voltage impressed across a magnetizing wire of the core as another exemplary embodiment of this invention.

A slightly different active feedback control to the external timing pin of the monostable M2 is used in the exemplary embodiment of FIG. 3 to achieve a proper setting of the core 14 to a new remnant flux value (after resetting in accordance with FIG. 2). To set the ferrite core 14 to a desired phase state, a "set" pulse of current I′ is passed through another magnetizing wire 22 linked to core 14 and driven by a similar high current control transistor 10′.

A typical prior art control approach is to integrate the voltage across a magnetizing wire of the ferrite, which integral is commonly considered to be proportional to the phase shift effected by the phase shifter after being so "set."

Since magnetization wire 20 is not now being driven, it can be thought of as the secondary winding of a 1:1 transformer. With set magnetization wire 22 as a primary winding, the voltage induced in wire 20 is a close approximation of the voltage applied across the driven set magnetization wire 22. By applying this induced secondary transformer voltage to the resistor/capacitor timing circuit of monostable M2, a first order approximation of the desired integral is achieved. The integrated voltage across capacitor C is connected as shown to control the external timing terminal of monostable M2.

Stated somewhat differently, if one reviews the typical conventional monostable multi-vibrator drive circuit of FIG. 1, it will be appreciated that a resistor/capacitor combination is used to provide a fixed time interval T1 by connecting the resistor to a fixed supply voltage. However if, as shown in FIG. 3, the fixed supply voltage is disconnected and, instead, a secondary winding voltage across the ferrite core is used as input to the RC circuit, one has now provided another form of closed loop control for the monostable which will automatically maintain set magnetization current I′ until the desired integrated voltage (i.e., desired phase state of ferrite core 14) has been attained. At that point, the voltage presented to the external timing pin of monostable M2 will automatically cause reversion to the quiescent stable state and the set operation for the ferrite core 14 will have been completed.

By adding a suitable circuit to pre-charge the capacitor C to a controlled preset voltage level, such a closed loop set magnetization current control can effect any desired predetermined remnant magnetization (and hence phase state).

As will be appreciated, the device-status feedback control of a monostable circuit via the external timing control terminal is being utilized in a novel and unique fashion in FIG. 2 so as to effect magnetic saturation or "reset" of core 14. In FIG. 3, a different type of feedback control is used so as to effect a desired "set" level of remnant magnetization in the core 14.

This type of feedback control in a monostable circuit permits the overall drive circuit to be made smaller and less expensive while at the same time remaining highly accurate. As will be understood in more detail by the following discussion, it also permits the use of but a single command pulse line to control both the reset and setting operations for one—or even more ferrite cores.

Figure 4:
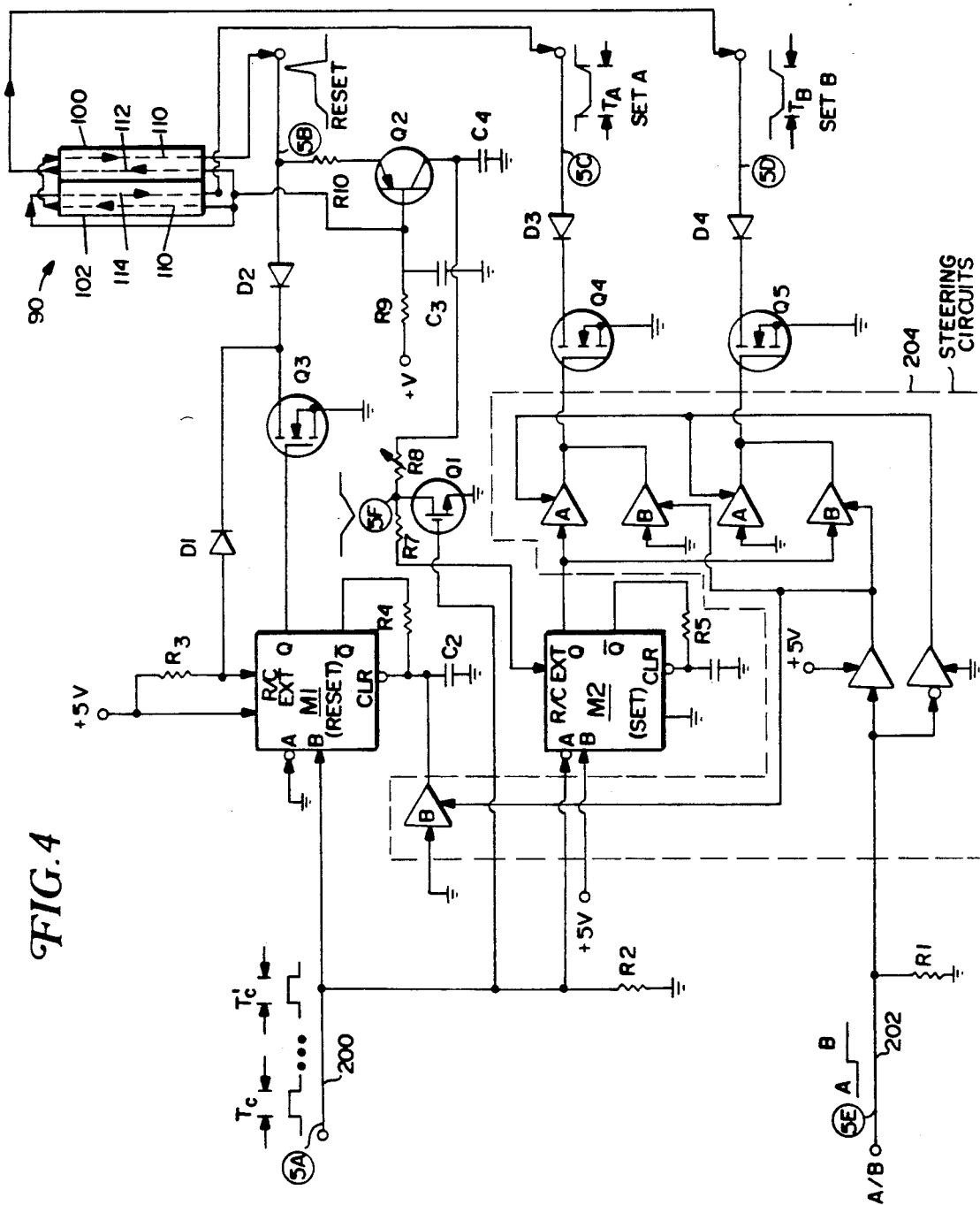
FIG. 4 is a simplified schematic diagram of a presently preferred exemplary embodiment of this invention for simultaneously resetting and sequentially setting a pair of ferrite cores in a dual toroid phase shifter.

In a presently preferred exemplary embodiment, one stage of a reciprocal hybrid mode phase shifter module (e.g. see Roberts and Roberts et al related applications above identified and hereby incorporated by reference) comprises a pair of single toroid hybrid mode phase shifters. For example, axially extended ferrimagnetic toroids 100 and 102 as shown in FIG. 4 may be associated with dedicated transmit and receive phase shifters respectively. These toroids typically are of square or rectangular cross-section and elongated in an axial dimension. In a dual toroid phase shifter, a pair of toroids may be placed in parallel side-by-side relationship within a waveguide. Typically, a slab of high dielectric material is disposed between the juxtaposed toroids so as to concentrate the RF fields in an area of the waveguide where a greater phase shift effect can be experienced. In a single toroid phase shifter, the center of the toroid may be loaded with a high dielectric core.

A common reset magnetizing wire 110 is typically threaded serially (but in opposite senses) through the cores of both toroids. Separate set magnetizing wires 112 and 114 are respectively threaded through the core of toroids 100 and 102 (with polarity opposite that of the reset wire in each respective core). For more detailed understanding of the phase shifter 90 and the manner in which reset and set current pulses are used in conjunction with magnetizing wires, reference may be had to the earlier referenced U.S. Pat. No. 4,445,098 to Sharon et al.

Figure 5:
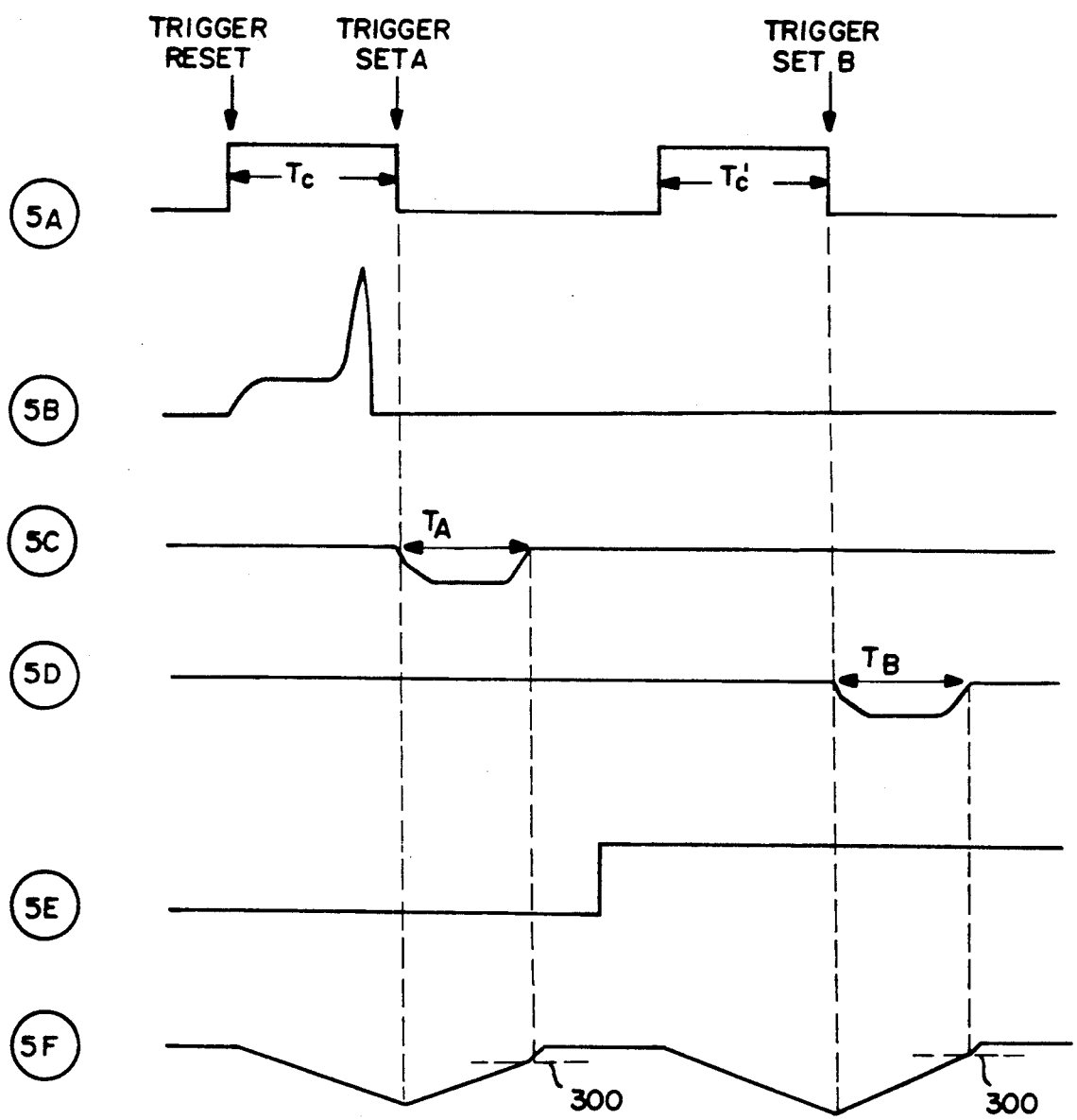
FIG. 5 is a collection of waveform diagrams 5A-5F illustrating typical waveforms at correspondingly specified points in the circuit of FIG. 4.

The waveforms 5A, 5B, 5C, 5D, 5E and 5F as shown in FIG. 5 represent waveforms at correspondingly marked nodes of the exemplary circuit diagrams shown in FIG. 4.

In general overview of the exemplary circuit shown at FIG. 4, it may be noted that a reset monostable M1 is used via current control transistor Q3 to control reset flux saturation current through reset winding 110 (e.g., following the FIG. 2 example). The set monostable M2 controls set magnetizing current through winding 114 via current control transistor Q4 in a first "set A" operation associated with a first input command pulse of duration $T_c$ (e.g., following the FIG. 3 example). The same set monostable M2 controls magnetizing current through winding 112 via current control pulse having duration $T'_c$ on the same input command line 200.

Between the successive command pulses on line 200, the state of A/B steering command on bus 202 changes so as to reconfigure steering circuits 204. This reconfiguration of steering circuits 204 effectively: (a) re-routes the output of set monostable M2 via Q5 (as opposed to Q4), and (b) inhibits operation of the reset monostable M1.

As previously noted, A/B steering command bus line 202 is connected in common to simultaneously control a plurality of modules such as shown in FIG. 4 (e.g., 4,096 in a 64×64 array). Power supply and ground busses are similarly connected in common to all modules. However, only a single command line 200 is required to be individually controlled, routed and connected to each module of the FIG. 4 type in this exemplary embodiment.

In the exemplary embodiment, the first command pulse sets a first single toroid phase shifter 102 for an RF transmit cycle while the subsequent second command pulse sets a second single toroid phase shifter 100 for an RF receive cycle in a reciprocal hybrid mode phase shifter module of the type disclosed and claimed in the above-referenced related Roberts application.

In a quiescent mode, both monostables M1 and M2 are in a quiescent stable state with their Q outputs at low logic levels. The A/B steering bus 202 is also at a low logic level thus steering the Q output of set monostable M2 to Q4 and leaving reset monostable M1 in an operative or uninhibited state. The capacitor C3 is charged to the supply voltage V (due to a prior cycle of operations as is now being described) while current drivers Q3, Q4 and Q5 are all in the "off" state.

Capacitor C3 acts as a local "power supply" for supplying the short relatively high magnitude current pulses periodically needed for resetting and setting current pulses in magnetization wires 110, 112 and 114 connected thereto.

Preset timing control transistor Q1 and "integrator" transistor Q2 are also in an "off" state. Timing control capacitor C4 (part of an RC circuit including C4, R7 and R8) for the external timing terminal of monostable M2 is, during this quiescent state, also maintained at a constant predetermined voltage (e.g., also approximately equal to the supply voltage).

Accordingly, in the quiescent state of the FIG. 4 circuit, substantially no current is flowing through any of the magnetizing wires 110, 112 or 114.

However, when a first command pulse of duration $T_c$ is supplied to the FIG. 4 circuit via its individual command line 200, the positive going pulse edge triggers monostable M1 to its quasi-stable state. Thus, transistor Q3 is turned "on" and reset current begins to flow from the "supply" capacitor C3 (and the connected supply bus). This immediately lowers the cathode voltage of "latch" diode D1 so as to temporarily maintain the external timing pin of monostable M1 at a voltage sufficiently low as to maintain the quasi-stable state. However, as depicted in waveform 5B, as soon as the ferrite cores 100, 102 become saturated, there will be a significant increase in current flow and a correspondingly significant increase in voltage at the cathode of diode 1 (which is included for temperature compensation purposes). The resulting increased voltage at the cathode of diode D1 permits the external timing terminal of monostable M1 (also the anode voltage of diode 1) to rise (via voltage divider action with R3) and toggle the monostable back to its quiescent stable state. In this manner, the reset current control transistor Q3 is turned "off" and reset current through winding 110 is automatically terminated upon reaching a saturated flux state in the toroid cores 100, 102.

At a subsequent time, a falling edge of the first command pulse will occur. This subsequent negative going transition triggers monostable M2 to its quasi-stable state. However, earlier, during the time period $T_c$ duration of the initial command pulse, transistor Q1 was turned "on" so as to controllably discharge capacitor C4 at a rate determined by resistance R8. Accordingly, at the trailing edge of the command pulse (when monostable M2 is triggered), the voltage across capacitor C4 will have been reduced by an amount related to the time duration $T_c$. The then remaining voltage constitutes an initial or "preset" voltage on capacitor C4.

Upon being triggered to its quasi-stable state, the Q output of multi-vibrator M2 (via steering circuits 204) turns set A current control transistor Q4" on" and thus initiates the flow of set magnetization current in wire 114 of toroid 102. As voltage is thus impressed across "primary" transformer winding 114, a corresponding voltage is induced in the "secondary" winding 110 which is applied via R10 across the base emitter junction of transistor Q2 so as to begin adding charge to capacitor C4. Since the emitter voltage of transistor Q2 is virtually fixed, resistor R10 and transistor Q2 form a transconductive amplifier whose output current is approximately proportional to the voltage induced in "secondary" winding 110. As earlier noted, this provides a first order approximate time integral of the voltage being impressed across the magnetizing winding 114.

Accordingly, this integrated voltage will be added to the preset voltage on capacitor C4 (i.e., the voltage remaining at the initiation of set current flow) so that the voltage on capacitor C4 will now begin to rise (e.g., see FIG. 5F).

The initial command pulse having now ceased, transistor Q1 is "off" and the increasing voltage across capacitor C4 is applied to the external timing terminal of monostable M2 via resistors R7, R8. When voltage at the external timing terminal reaches the requisite predetermined level (e.g., as indicated by 300 in FIG. 5F), monostable M2 will toggle back to its quiescent stable state.

In this manner, the current control transistor Q4 is automatically turned "off" to terminate the set A magnetization current through winding 114 when the integrated voltage impressed across the magnetization windings has reached a requisite value. Since the preset starting voltage on capacitor C4 is determined by the duration of command pulse $T_c$, it follows that the resulting phase state set into ferrite core 102 has also been effectively controlled by the duration parameter $T_c$.

The next significant event is a transition in the A/B steering bus as depicted at FIG. 5E. This conditions the steering circuits 204 so as to inhibit monostable M1 while re-directing the Q output of monostable M2 to set B current control transistor Q5. The latter transistor is, in turn, connected to the set magnetization winding 112 of toroid 100.

Thereafter, a further command pulse of duration $T'_c$ on the same command line 200 has no effect on monostable M1. However, it will again cause a controlled discharge of capacitor C4 (via transistor Q1) which is now related to the duration $T'_c$ of the second command pulse. As before, when the second pulse terminates, the negative going edge triggers monostable M2 to its quasi-stable state. However, due to the reconfiguration of steering circuits 204, this now results in turning transistor Q5 "on" and begins the flow of set current through winding 112 of toroid 100. As before, this current flow will continue until the integrated voltage induced into the secondary winding 110 (via transistor Q) succeeds in raising the voltage of capacitor C4 to the predetermined level of 300 thus toggling monostable M2 back to its quiescent stable state. This terminates the flow of set current to leave a remnant magnetic flux in core 100 directly related to the duration parameter $T'_c$ of the second command pulse.

Diodes D2, D3 and D4 are merely provided for protective purposes so as to prevent reverse polarity current flows.

The operation of steering circuits 204 is believed to be substantially self-explanatory from FIG. 4. As will be seen, a first logic level for steering state A provides operating or enabling supply voltage to tri-state buffers A. On the other hand, opposite logic level input on the A/B steering bus reconditions the circuit so as to turn tri-state buffers A "off" (to a high impedance output state) and, alternatively, to supply operating or enabling supply inputs to tri-state buffers B. After a complete cycle as shown in FIG. 5, the whole circuit can be returned to an initial state (after the set B current flow has ceased) by again transitioning the logic level on the A/B steering bus 202.

Practical phased array configurations often require similar resetting and setting of multiple pairs of ferrite cores. There are many possible configurations of magnetization wire connections that might be used so as to simultaneously reset or set those cores requiring identical actions. The circuit of FIG. 6 provides one illustration of a possible wiring diagram for magnetizing wires 110, 112 and 114 which passes through not only a first pair of toroids 100, 102 but also through a second pair of toroids 100' and 102' (for effecting simultaneous control over both pairs).

Figure 6:
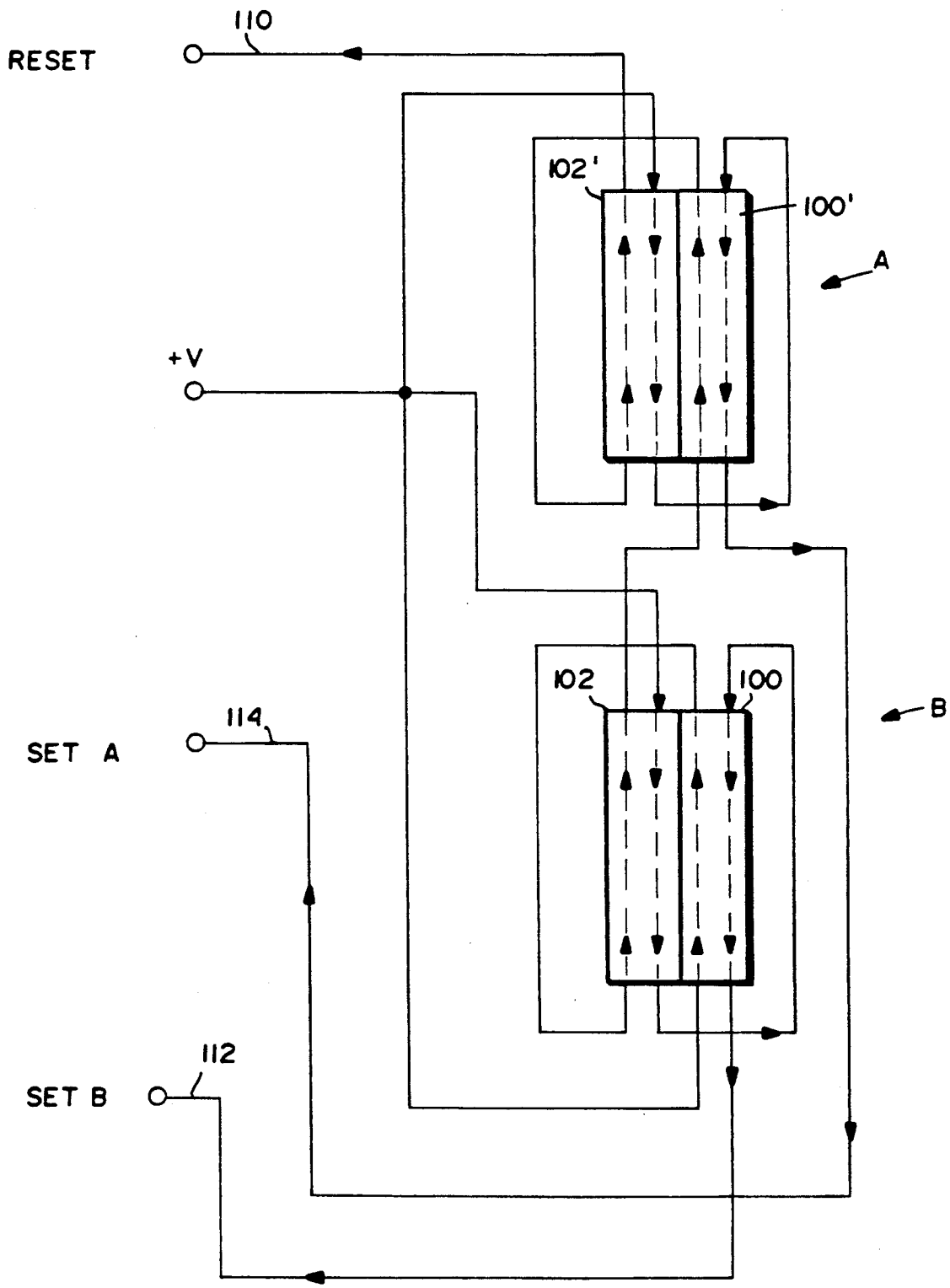
FIG. 6 is a circuit diagram showing the manner in which plural successive pairs of dual toroid cores may be simultaneously reset and successively set to predetermined levels of magnetization using a single drive circuit such as shown in FIG. 4.

In view of the previous discussion, it will be understood that the connections shown in FIG. 6 will result in simultaneously resetting all four of the magnetic cores. The set A current pulses will result in simultaneous setting of common remnant flux values in cores 100' and 102'. The set B current pulses will simultaneously produce desired common remnant flux states for toroids 100 and 102 (assuming that the toroids all are of equal size, shape and composition). As will be appreciated, for a given specific application, there are many possible wiring circuits that might be used so as to permit simultaneous reset and setting operations on plural cores using but a single driver module of the FIG. 4 type.

As a brief recapitulation, the FIG. 4 driver circuits supplies a single reset current pulse on line 110 and two set current pulses (a first one on line 114 followed by a second one on line 112). The reset pulse (used to simultaneously reset both toroids 100, 102) begins when command line 202 transitions to a high logic level. The reset monostable M1 is edged triggered so that the later negative-going transition is ignored. The reset current pulse continues until it reaches a selectable peak current level. Preferably, the output current may actually be measured by a sense circuit and fed to a comparator so as to maintain current peaks approximately constant over wide temperature ranges.

At the same time the reset pulse begins, a timing circuit (e.g., Q1) begins operating so as to ultimately control the desired set phase state to be attained by a subsequent set current pulse. The falling edge of the initial command pulse actually triggers the beginning of the first set current pulse. By changing the duration of the initial command pulse, the timing circuit is controlled so as to select a desired ultimate phase state associated with the set pulse now initiated. The set voltage impressed across a toroid winding is effectively integrated and when this integrated value (including a pre-stored value determined by the timing circuit), equals a fixed predetermined comparison value, the set current pulse is turned "off."

As will be appreciated, in this exemplary embodiment, it is important that the set pulse is never initiated during a reset pulse. That is, it is important that the command pulse have a duration that is at least as long as the maximum possible reset pulse (which is, of course initiated by the positive going transition of the command pulse but which terminates automatically whenever flux saturation is achieved). Preferably, an adjustment (e.g., variable resistor R8) is provided so as to insure that the complete range of desired minimum to maximum phase state changes can be attained using command pulses having a minimum duration at least somewhat longer than the expected maximum duration of a reset pulse. Thus, reset and set pulses should never overlap regardless of the previously existing phase state of any toroid and regardless of the next phase state to which that toroid is to be set.

The A/B steering bus line 202 is toggled before a second command pulse is transmitted along the same dedicated command line 200. The width of the second command pulse (i.e., the length of time between edges) is again adjustable to a value $T'_c$ so as to obtain a desired phase state for the second phase shifter toroid being set during this second sub-cycle of operation. Due to inhibition by steering circuits 204, the rising edge of the second command pulse is ignored by monostable M1 (thereby preventing the flow of any additional reset current in a latch wire 110). This insures that the first set phase shifter toroid is left in the set state just attained. Of course, the second phase shifter having already been reset during the first command pulse will also remain in its reset state until the set B current pulse begins (as triggered by the falling edge of the second command pulse).

In addition to simplified wiring, the single encoded command pulse line 200 permits the fundamental frequency of command pulses on that line to be maintained lower in frequency than the fundamental frequency of a conventional train of command pulses typically required to send the same information in a serial digital transmission scheme. Thus, susceptibility to transmission noise effects and noise emissions also tend to be reduced significantly. This invention also has advantages over analog amplitude transmission techniques since phase setting data is determined only by the time duration between two pulsed transition edges—as opposed to an analog voltage level which would be susceptible to amplitude modulated noise sources.

A combination of a single command line for data transmission to each driver module of the FIG. 4 type and the unique use of monostable multivibrators with device-status feedback control in such circuits makes this driver circuit truly unique. Among other things, such features drastically reduce the necessary size and cost of the usual large and expensive array of circuit elements required to effectively drive ferrite phase shifters.

While only a few exemplary embodiments of this invention have been described in detail, those skilled in the art will recognize that many variations and modifications may be made in this exemplary embodiment while yet retaining many of the novel features and advantages of this invention. Accordingly, all such variations and modifications are intended to be included in the scope of the appended claims.

What is claimed is:

1. A drive circuit for controlling electrical current flow in a conductor to a device having plural states which are selectively determined by said current flow, said circuit comprising:

a control circuit comprising a monostable multivibrator circuit having an externally accessible timing control terminal, said multivibrator also having a first output state and a first input for effecting change to second output state which thereafter reverts back to said first output state when a voltage at said timing control terminal exceeds a predetermined magnitude;

means coupling said conductor to said control circuit so as to cause current to flow therein when said control circuit is in said second output state; and feedback control means coupled to said timing control terminal and to said device for providing said voltage exceeding a predetermined magnitude to said timing control terminal in response to said device attaining a predetermined state.

2. A drive circuit as in claim 1 wherein said feedback control means comprises:

means for monitoring the magnitude of electrical current flowing in said conductor and, in response to a predetermined current increase, providing said voltage exceeding a predetermined magnitude to said timing control terminal.

3. A drive circuit for controlling electrical current flow in a conductor to a device having plural states which are selectively determined by said current flow, said circuit comprising:

a control circuit having a first output state and a first input for effecting change to a second output state which thereafter reverts back to said first output state when a predetermined electrical condition is present at a second input;

means coupling said conductor to said control circuit so as to cause current to flow therein when said control circuit is in said second output state;

feedback control means coupled to said second input and to said device for providing said predetermined electrical condition to said second input in response to said device attaining a predetermined state; and means for monitoring the magnitude of electrical current flowing in said conductor and, in response to a predetermined current increase, providing said predetermined electrical condition to said second input;

said means for monitoring including a voltage divider having a predetermined resistance connected at a divider node between a source of electrical voltage and a portion of said control circuit which controls current flow through said conductor, the divider dropping the voltage at said node during current flows below a predetermined magnitude but which voltage increases at said node when said current flow increases above said predetermined magnitude;

said node being electrically coupled to said second input of the control circuit to provide a voltage in excess of a predetermined magnitude at said predetermined electrical condition.

4. A drive circuit for controlling electrical current flow in a conductor to a device having plural state which are selectively determined by said current flow, said circuit comprising:

a set control circuit having a first output state and a first input for effecting change to a second output state which thereafter reverts back to said first output state when a predetermined electrical condition is present at a timing control terminal;

means coupling said conductor to said control circuit so as to cause current to flow therein when said control circuit is in said second output state, and feedback control means coupled to said timing control terminal and to said device for providing said predetermined electrical condition to said timing control terminal in response to said device attaining a predetermined state, said feedback control means comprising an integration circuit connected to integrate a device voltage related to current flow in said conductor and to provide a resulting integrated voltage as said predetermined electrical condition to said timing control terminal of the control circuit.

5. A drive circuit for controlling electrical current flow in a conductor to a device having plural states which are selectively determined by said current flow, said circuit comprising:

a control circuit having a first output state and a first input for effecting change to a second output state which thereafter reverts back to said first output state when a predetermined electrical condition is present at a second input;

means coupling said conductor to said control circuit so as to cause current to flow therein when said control circuit is in said second output state;

feedback control means coupled to said second input and to said device for providing said predetermined electrical condition to said second input in response to said device attaining a predetermined state;

an integration circuit connected to integrate a device voltage related to current flow in said conductor and to provide a resulting integrated voltage to said second input of the control circuit;

said integration circuit comprising a charge control circuit connected to a capacitor for selectively changing the voltage on said capacitor to a preset value corresponding to a desired state of said device; and means including a transistor connected between said conductor and said capacitor, said transistor having conductivity controlled by the voltage appearing on said conductor, for thereafter integrating said device voltage onto said capacitor in superposition with said preset value so as to reach a predetermined set voltage when said device has attained said desired state;

said capacitor being coupled to said second input so that the voltage on said capacitor produces said predetermined electrical condition.

6. A drive circuit for effecting controlled magnetization state changes in a magnetizable core having at least one conductive wire electromagnetically linked thereto, said drive circuit comprising:

a control circuit comprising a monostable multivibrator circuit having an externally accessible timing control terminal, said multivibrator having a first output state and a first input for effecting change to a second output state which thereafter reverts back to said first output state when the voltage at said timing control terminal exceeds a predetermined magnitude;

means coupling said conductive wire to said control circuit so as to cause magnetizing current to flow in the wire when said control circuit is in said second output state; and feedback control means coupled to said timing control terminal and to the magnetization state of said core for providing said voltage exceeding a predetermined magnitude to said timing control terminal in response to said core reaching a predetermined magnetization state.

7. A drive circuit as in claim 6 wherein said feedback control means comprises:

means for monitoring the magnitude of electrical current flowing in said wire and, in response to a predetermined current increase occurring when said core becomes magnetically saturated, providing said voltage exceeding a predetermined magnitude to said timing control terminal.

8. A drive circuit as in claim 7 wherein said means for monitoring includes:

a voltage divider having a predetermined resistance connected at a divider node between a source of electrical voltage and a portion of said control circuit which controls current flow through said wire, the divider dropping the voltage at said node during magnetizing current flows when said core is not magnetically saturated but which voltage increases at said node when said core becomes magnetically saturated;

said node being electrically coupled to said timing control terminal of the control circuit to provide a voltage in excess of a predetermined magnitude as said predetermined electrical condition.

9. A drive circuit as in claim 6 wherein said feedback control means comprises:

a further conductive wire electromagnetically linked to said core and therefore providing a secondary transformer voltage related to the voltage imposed across said first-mentioned conductive wire; and an integration circuit connected to integrate said secondary voltage and to provide a resulting integrated voltage to the timing control terminal of the multivibrator to cause said multivibrator to revert to said first output state when the integrated voltage exceeds said predetermined magnitude.

10. A drive circuit for effecting controlled magnetization state changes in a magnetizable core having at least one conductive wire electromagnetically linked thereto, said drive circuit comprising:

a control circuit having a first output state and a first input for effecting change to a second output state which thereafter reverts back to said first output state when a predetermined electrical condition is present at a second input;

means coupling said conductive wire to said control circuit so as to cause magnetizing current to flow in the wire when said control circuit is in said second output state;

feedback control means coupled to said second input and to the magnetization state of said core for providing said predetermined electrical condition to said second input in response to said core reaching a predetermined magnetization state;

a further conductive wire electromagnetically linked to said core and therefore providing a secondary transformer voltage related to the voltage imposed across said first-mentioned conductive wire;

an integration circuit connected to integrate said secondary voltage and to provide a resulting integrated voltage to the second input of the control circuit;

said integration circuit comprising a change control circuit connected to a capacitor for selectively changing the voltage on said capacitor to a preset value corresponding to a desired set magnetization state of said core; and means including a transistor connected between said conductor and said capacitor, said transistor having a conductance which is controlled by the voltage on said conductor, for thereafter integrating said secondary voltage onto said capacitor in superposition with said present value so as to reach a predetermined set voltage when said core has attained said desired set magnetization state;

said capacitor being coupled to said second input so that the voltage on said capacitor produces said predetermined electrical condition.

11. A control circuit for selectively changing the operational state of a connected device, said circuit comprising:

a monostable multivibrator having an input response to an edge of an applied pulse for placing the multivibrator in a quasi-stable state, a timing control terminal for causing the multivibrator to revert to its stable state when a given voltage is applied thereto and an output that is at a different voltage when the multivibrator is in an unstable state;

device state-changing means coupled to the output of said multivibrator for changing the operational state of said device while the multivibrator is in its quasi-stable state;

sensing means coupled to said device for producing a voltage that increases in response to the changing states of the device, and means for coupling said voltage to said timing control terminal so as to cause the multivibrator to revert to its stable state when the voltage reaches said given value.

12. A control circuit for selectively changing the operational state of a connected device, said circuit comprising:

a monostable multivibrator having an input responsive to an edge of an applied pulse for placing the multivibrator in a quasi-stable state, a control input for causing the multivibrator to revert to its stable state when a given voltage is applied thereto and an output that is at a different voltage when the multivibrator is in an unstable state;

device state-changing means coupled to the output of said multivibrator for changing the operational state of said device while the multivibrator is in its quasi-stable state, said device state-changing means applies a voltage across a winding coupled to a magnetizable core to produce a current therein that will magnetically saturate the core;

sensing means coupled to said device for producing a voltage that increases in response to the changing states of the device, said sensing means produces a voltage corresponding to the current in said winding, and means for coupling said voltage to said control input so as to cause the multivibrator to revert to its stable state when the voltage reaches said given value. A control circuit for selectively changing the operational state of a connected device, said circuit comprising:

a monostable multivibrator having an input responsive to an edge of an applied pulse for placing the multivibrator in a quasi-stable state, a control input for causing the multivibrator to revert to its stable state when a given voltage is applied thereto and an output that is at a different voltage when the multivibrator is in an unstable state;

device state-changing means coupled to the output of said multivibrator for changing the operational state of said device while the multivibrator is in its quasi-stable state, said device state-changing means applies a voltage across a winding coupled to a magnetizable core to produce a current therein that will magnetically saturate the core;

sensing means coupled to said device for producing a voltage that increases in response to the changing states of the device, said sensing means produces a voltage corresponding to the current in said winding, and means for coupling said voltage to said control input so as to cause the multivibrator to revert to its stable state when the voltage reaches said given value.

13. A control circuit for selectively changing the operational state of a connected device, said circuit comprising:

a monostable multivibrator having an input responsive to an edge of an applied pulse for placing the multivibrator in a quasi-stable state, a timing control terminal for causing the multivibrator to revert to its stable state when a given voltage is applied thereto and an output that is at a different voltage when the multivibrator is in an unstable state, said multivibrator changes to its quasi-stable state in response to the leading edge of a pulse applied to its input;

device state-changing means coupled to the output of said multivibrator for changing the operational state of said device while the multivibrator is in its quasi-stable state;

sensing means coupled to said device for producing a voltage that increases in response to the changing states of the device;

means for coupling said voltage to said timing control terminal so as to cause the multivibrator to revert to its stable state when the voltage reaches said given value;

a second multivibrator having an input that changes the second multivibrator to a quasi-stable state in response to the trailing edge of a pulse, a control input for causing the multivibrator to revert to its stable state when a predetermined voltage is applied thereto and an output that is at a different voltage when the second multivibrator is in its quasi-stable state as compared to when it is in a stable state, a capacitor, means for changing the voltage on said capacitor while said first mentioned multivibrator is in its quasi-stable state, second device state-changing means coupled to the output of said second multivibrator for changing the operational state of said device while the second multivibrator is in its quasi-stable state, second sensing means coupled to said second device state-changing means for producing a voltage that increases in response to the changing states of the device, and means for deriving the sum of the latter voltage and the voltage remaining across the capacitor when said first multivibrator reverts to its stable state and for coupling the sum of the voltage to the control input of said second multivibrator so as to cause the second multivibrator to revert to its stable state when the sum reaches said predetermined value.

14. A control circuit as set forth in claim 13 wherein:
said second device state-changing means applies a voltage across a winding coupled to a magnetizable core so as to cause current to flow therein; and
said second sensing means produces a voltage corresponding to the integral of said applied voltage.

15. A circuit for saturating a magnetic core, said circuit comprising:
a winding,
a monostable multivibrator having an input responsive to the leading edge of a command pulse applied thereto to shift the multivibrator from a stable state to an unstable state, a control input for causing the multivibrator to reassume its stable state when a given voltage is applied thereto and an output having a voltage that depends on the multivibrator state;
a switch,
means coupled to said output for keeping said switch closed while said multivibrator is in an unstable condition,
a source of DC voltage;
a current-to-voltage converter;
said winding, switch and current-to-voltage converter being connected in series across said source of DC voltage, and
means for coupling the voltage produced by said current-to-voltage converter to said control input of said multivibrator so as to cause it to revert to its stable state when said current causes magnetic saturation of said core.

16. A circuit for establishing a set remnant magnetic flux in a core of magnetizable material, said circuit comprising:
a monostable multivibrator having a trigger input, a timing control terminal and an output,
means for applying a command pulse to said trigger input for causing said multivibrator to assume an unstable state,
a DC voltage supply,
a switch and a magnetizing winding electromagnetically linked to said core and connected in series across said voltage supply,
means coupled to said output for closing said switch when said multivibrator is in an unstable state,
means coupled to said winding for providing a first DC voltage corresponding to the integral of the voltage across said winding,
means for providing a predetermined second DC voltage, and
means for adding said first and second DC voltages and for applying their sum to said timing control terminal so as to cause said multivibrator to reassume its stable state when the sum reaches a predetermined value, whereby the amount of remnant magnetization in said core depends on said predetermined second voltage value.

17. A circuit for producing a given amount of remnant magnetic flux in a magnetizable core, said circuit comprising:
a first monostable multivibrator having a leading edge trigger input coupled to a command, input terminal and also having a timing control terminal and an output,
a first winding for producing flux in a given direction in said core,
a DC voltage source,
means responsive to the voltage at said output while said multivibrator is in an unstable state for coupling said DC voltage source across said first winding so as to cause current to flow therein,
means for producing a second voltage corresponding to said current,
means for coupling said second voltage to said timing control terminal so as to cause said multivibrator to revert to its stable state when the second voltage reaches a given value,
a capacitor,
means for charging said capacitor to a given preset voltage,
means coupled to said command input terminal for discharging said capacitor at a given rate during a command pulse applied thereto,
a second monostable multivibrator having a trailing edge trigger input also coupled to said command input terminal and also having a control input and an output,
a second winding for producing flux in a second opposite direction in said core,
means responsive to voltage at the output of said second multivibrator while it is in an unstable state for coupling said DC voltage course across said second winding,
means for charging said capacitor in response to voltage induced in said first winding by voltage in said second winding so as to increase the voltage on said capacitor at a rate proportional to the voltage induced in said first winding, and
means coupling the voltage on said capacitor to the control input of said second multivibrator so as to cause said second multivibrator to revert to its stable state when the voltage at its control input reaches a predetermined value.

18. A drive circuit for resetting and setting the remnant magnetic flux of at least one magnetizable core, each core being linked to at least one magnetization wire, said circuit comprising:
a first monostable circuit connected to control reset magnetization current through a magnetization wire of the core in response to the leading edge of an input command pulse; and
a second monostable circuit connected to control set magnetization current through a magnetization wire of the core in response to the trailing edge of said input common pulse and effecting a magnitude of remnant magnetization in said core controlled by the time duration of said input command pulse.

19. A drive circuit as in claim 18 further comprising:
a steering circuit for selectively inhibiting further reset operation of said first monostable circuit and for simultaneously redirecting the output of said second monostable circuit to drive magnetization current through a magnetization wire of a further core in response to the trailing edge of a further input command pulse and effecting a magnitude of remnant magnetization in said further core controlled by the time duration of said further input command pulse.

20. A method for controlling electrical current flow in a conductor to a device having plural states which are selectively determined by said current flow, said method comprising:

in a control circuit comprising a monostable multivibrator circuit having an externally accessible timing control terminal, effecting a second output state in response to a first input which thereafter reverts back to a first output state when a predetermined electrical condition is present at said timing control terminal;

coupling said conductor to said control circuit and causing current to flow therein when said control circuit is in said second output state; and providing said predetermined electrical condition to said timing control terminal in response to said device attaining a predetermined state.

21. A method for resetting and setting the remnant magnetic flux of at least one magnetizable core, each core being linked to at least one magnetization wire, said method comprising:

controlling reset magnetization current through a magnetization wire of the core by triggering a first monostable circuit in response to the leading edge of an input command pulse; and controlling set magnetization current through a magnetization wire of the core by triggering a second monostable circuit in response to the trailing edge of said input command pulse and effecting a magnitude of remnant magnetization in said core controlled by the time duration of said input command pulse.

22. A method as in claim 21 further comprising:

selectively inhibiting further reset operation of said first monostable circuit and simultaneously redirecting the output of said second monostable circuit to drive magnetization current through a magnetization wire of a further core in response to the trailing edge of a further input command pulse and effecting a magnitude of remnant magnetization in said further core controlled by the time duration of said further input command pulse.

23. A method for resetting and setting the remnant magnetic flux of at least one magnetizable core using a single command line, each core being linked to at least one magnetization conductor, said method comprising:

using the leading edge of an input command pulse to trigger a current flow through the core to reset the core magnetization;

terminating the reset magnetization when the current through the core reaches a predetermined value that is monitored by a feedback circuit that turns off the reset current;

using the duration of the command pulse as a reference to set a predetermined charge on a storage device;

applying the trailing edge of the input command pulse to start the set magnetization current through the core;

superimposing the current flowing through the magnetization conductor of the core onto the predetermined charge in the storage device;

terminating the set magnetization current when the charge in the storage device reaches a predetermined value.

* * * * *